US008471735B2

(12) United States Patent
Qin

(10) Patent No.: US 8,471,735 B2
(45) Date of Patent: Jun. 25, 2013

(54) METHOD AND APPARATUS FOR COMPRESSING OR DECOMPRESSING DATA IN FIBER CHANNEL SERVICES

(75) Inventor: Wei Qin, Shenzhen (CN)

(73) Assignee: ZTE Corporation, Shenzhen, Guangdong Province (CN)

(*) Notice: Subject to any disclaimer, the term of this patent is extended or adjusted under 35 U.S.C. 154(b) by 8 days.

(21) Appl. No.: 13/381,881

(22) PCT Filed: Sep. 11, 2009

(86) PCT No.: PCT/CN2009/073896
§ 371 (c)(1),
(2), (4) Date: Dec. 30, 2011

(87) PCT Pub. No.: WO2011/000179
PCT Pub. Date: Jan. 6, 2011

(65) Prior Publication Data
US 2012/0112935 A1    May 10, 2012

(30) Foreign Application Priority Data
Jul. 2, 2009 (CN) .......................... 2009 1 0088479

(51) Int. Cl.
H03M 7/30 (2006.01)

(52) U.S. Cl.
USPC .................................. 341/87; 341/55; 341/58

(58) Field of Classification Search
USPC .......................................... 341/55–56, 58, 87
See application file for complete search history.

(56) References Cited

U.S. PATENT DOCUMENTS

| 4,486,876 A | 12/1984 | Gaunt, Jr. et al. | |
|---|---|---|---|
| 6,424,347 B1 | 7/2002 | Kwon | |
| 6,430,201 B1* | 8/2002 | Azizoglu et al. | 370/535 |
| 7,042,904 B2* | 5/2006 | Kamiya | 370/466 |
| 7,471,697 B2* | 12/2008 | Kamiya et al. | 370/467 |
| 2009/0129461 A1 | 5/2009 | Sundararajan et al. | |

FOREIGN PATENT DOCUMENTS

| CN | 1444351 | 9/2003 |
|---|---|---|
| CN | 101046917 | 10/2007 |
| CN | 101162973 | 4/2008 |
| WO | WO03058973 A2 | 7/2003 |

* cited by examiner

Primary Examiner — Khai M Nguyen
(74) Attorney, Agent, or Firm — Ladas & Parry LLP

(57) ABSTRACT

The present invention provides a method and apparatus for compressing or decompressing data in Fiber Channel (FC) services. In the solution of the present invention, when compressing FC data, a K code indicator bit and an ERR code indicator bit are compressed into a K/ERR code indicator bit, and 8b codes and the K/ERR code indicator bit are compressed into 9b codes; when decompressing FC data, the 9b code is decompressed into 8b codes and a K/ERR code indicator bit, and the K/ERR code indicator bit is decompressed into a K code indicator bit and an ERR code indicator bit. The solution provided by the present invention overcomes the disadvantages that in conventional art, when processing FC service, the K code indicator bit and the ERR code indicator bit must be retained, and the K code and the ERR code are processed separately, which lead to a high bandwidth utilization ratio and a complex processing procedure. The solution provided by the present invention fully utilizes the current FC service bandwidth, enables to process the FC service with fewer resources, greatly simplifies the FC service processing, and promotes the spread of the FC technology.

11 Claims, 2 Drawing Sheets

METHOD AND APPARATUS FOR COMPRESSING OR DECOMPRESSING DATA IN FIBER CHANNEL SERVICES

CROSS-REFERENCE TO RELATED APPLICATIONS:

This application is the U.S. National Stage of International Patent Application No. PCT/CN2009/073896 filed on Sep. 11, 2009, which claims priority to Chinese Patent Application Number 200910088479.8 filed on Jul. 2, 2009, the disclosures of which are hereby incorporated by reference in their entireties.

FIELD OF THE INVENTION

The present invention relates to the communication transmission network technologies, and in particular, to a method and an apparatus for compressing or decompressing data in Fiber Channel (FC) services.

BACKGROUND OF THE INVENTION

FC service is mostly applied to Fiber Channels. When processing FC service data, a sending terminal compresses the FC data from 8b codes into 10b codes, namely compresses 8-bit data into 10-bit data, and then transmits the same through the optical transmission network; a receiving terminal decompresses the FC data from 10b codes into 8b codes, and then processes the FC service data as 8b codes.

At present, the format of FC service data is 8b codes plus a K code indicator bit and an ERR code indicator bit. Accordingly, when the 8b codes is compressed, the 8b codes plus 1b of the K code indicator bit and 1b of the ERR code indicator bit gets 10b codes, namely 10-bit data; after decompressing the 10b codes, the 8b codes, a K code indicator bit and an ERR code indicator bit which still have 10 bits are got.

During the above conversion, the bit width of FC service data has not changed at all, the K code indicator bit and the ERR code indicator bit need to be processed separately, which makes the subsequent FC service processing procedure very complex. No effective solutions have been proposed to solve the above problem till now.

SUMMARY OF THE INVENTION

The present invention is proposed for the problem that the K code indicator bit and the ERR code indicator bit need to be processed separately when compressing or decompressing data, which makes the subsequent FC service processing procedure very complex. Therefore, the present invention provides a method and an apparatus for compressing or decompressing data in Fiber Channel services to solve the above-mentioned problem, so as to improve the bandwidth utilization ratio and reduce the processing complexity.

The technical solution of the present invention is realized as follows:

According to one aspect of the present invention, a method for compressing data in Fiber Channel services is provided, the method comprises: compressing a K code indicator bit and an ERR code indicator bit into a K/ERR code indicator bit, and compressing 8b codes and the K/ERR code indicator bit into 9b codes.

Preferably, compressing a K code indicator bit and an ERR code indicator bit into a K/ERR code indicator bit can comprise: judging whether an ERR code is contained in the currently received FC data, wherein if the ERR code is contained, then encoding the ERR code indicator bit into a K/ERR code indicator bit; if the ERR code is not contained, then judging whether a K code is contained in the currently received FC data, and if the K code is contained, then encoding the K code indicator bit into a K/ERR code indicator bit, if the K code is not contained, encoding the K/ERR code indicator bit into an indicator bit without a K code or an ERR code.

Preferably, after 9b codes are obtained from the compression, the method further comprises: decompressing the 9b codes into 8b codes and a K/ERR code indicator bit, and decompressing the K/ERR code indicator bit into a K code indicator bit and an ERR code indicator bit.

Preferably, decompressing the K/ERR code indicator bit into a K code indicator bit and an ERR code indicator bit comprises: determining whether an ERR code or a K code is contained in the currently received FC data according to the K/ERR code indicator bit, wherein if the ERR code or the K code is contained, then judging whether the ERR code is contained in the currently received FC data according to the specific content of the 8b codes, wherein if the ERR code is contained, then the K/ERR code indicator bit is determined to be an ERR code indicator bit, and if the K code is contained, then the K/ERR code indicator bit is determined to be a K code indicator bit; if neither the ERR code nor the K code is contained, the K/ERR code indicator bit is determined to be an indicator bit without a K code or an ERR code.

According to another aspect of the present invention, a method for decompressing data in Fiber Channel services is provided, comprising: decompressing a 9b codes into 8b codes and a K/ERR code indicator bit, and decompressing the K/ERR code indicator bit into a K code indicator bit and an ERR code indicator bit.

Preferably, decompressing the K/ERR code indicator bit into a K code indicator bit and an ERR code indicator bit, comprising: determining whether an ERR code or a K code is contained in the currently received FC data according to the K/ERR code indicator bit, wherein if an ERR code or a K code is contained, then judging whether the ERR code is contained in the currently received FC data according to the specific content of the 8b codes, wherein if the ERR code is contained, then the K/ERR code indicator bit is determined to be an ERR code indicator bit, if the K code is contained, then the K/ERR code indicator bit is determined to be a K code indicator bit; if neither the ERR code nor the K code is contained, the K/ERR code indicator bit is determined to be an indicator bit without a K code or an ERR code.

According to another aspect of the present invention, an apparatus for compressing data in Fiber Channel services is provided, the apparatus comprises: a determination unit and a compression unit, wherein, the determination unit is configured to compress a K code indicator bit and an ERR code indicator bit into a K/ERR code indicator bit; the compression unit is configured to compress 8b codes and the K/ERR code indicator bit into 9b codes.

Preferably, the determination unit compressing a K code indicator bit and an ERR code indicator bit into a K/ERR code indicator bit specifically comprises: judging whether an ERR code is contained in the currently received FC data, wherein if the ERR code is contained, then encoding the ERR code indicator bit into a K/ERR code indicator bit; if the ERR code is not contained, then judging whether a K code is contained in the currently received FC data, wherein if the K code is contained, then encoding the K code indicator bit is coded into a K/ERR code indicator bit, and if the K code is not contained, encoding the K/ERR code indicator bit into an indicator bit without a K code or an ERR code.

According to another aspect of the present invention, an apparatus for decompressing data in Fiber Channel services is provided, the apparatus comprises: a decompression unit and a recognition unit, wherein, the decompression unit is configured to decompress 9b codes into 8b codes and a K/ERR code indicator bit; the recognition unit is configured to decompress the K/ERR code indicator bit into a K code indicator bit and an ERR code indicator bit.

Preferably, the recognition unit decompressing the K/ERR code indicator bit into a K code indicator bit and an ERR code indicator bit specifically comprises: determining whether an ERR code or a K code is contained in the currently received FC data according to the K/ERR code indicator bit, wherein if the ERR code or the K code is contained, then judging whether the ERR code is contained in the currently received FC data according to the specific contents of the 8b codes, wherein if the ERR code is contained, then the K/ERR code indicator bit is determined to be an ERR code indicator bit, if the K code is contained, and then the K/ERR code indicator bit is determined to be a K code indicator bit; if neither the ERR code nor the K code is contained, the K/ERR code indicator bit is determined to be an indicator bit without a K code or an ERR code.

The solution provided by the present invention overcomes the disadvantages that in conventional art, when processing FC services, the K code indicator bit and the ERR code indicator bit must be retained, and the K code and the ERR code are processed separately, which lead to a low bandwidth utilization ratio and a complex processing procedure. The solution provided by the present invention fully utilizes the current FC service bandwidth, enables to process the FC services with fewer resources, greatly simplifies the FC service processing, and promotes the spread of the FC technology.

The solution of the present invention can realize a compression or decompression of the FC data, make the whole system of the FC service simpler, and can save 10% bandwidth of the FC service, improve the utilization ratio of the bandwidth and the device, and simplify the complexity for processing the FC service.

BRIEF DESCRIPTION OF THE DRAWINGS

The drawings illustrated herein are used to provide further understanding of the present invention, and constitute a part of this application. The exemplary embodiments of the present invention and their descriptions are used to explain the present invention and shall not be improper limitations to the present invention. In which.

DETAILED DESCRIPTION OF THE PREFERRED EMBODIMENTS

Considering the problem that when compressing or decompressing data, the K code indicator bit and the ERR code indicator bit must be processed separately, which makes the subsequent FC service processing procedure very complex, a method and an apparatus for compressing or decompressing data in Fiber Channel services are provided in the embodiments of the present invention.

In the present invention, when compressing FC data, a K code indicator bit and an ERR code indicator bit are compressed into a K/ERR code indicator bit, and 8b codes and the K/ERR code indicator bit are compressed into 9b codes; when decompressing FC data, the 9b codes are decompressed into 8b codes and a K/ERR code indicator bit, and the K/ERR code indicator bit is decompressed into a K code indicator bit and an ERR code indicator bit. Thus it can be seen that, the transmission of FC service data is reduced from the existing 10b codes to 9b codes in the present invention, 10% bandwidth in the FC services being saved.

It should be noted that, the embodiments of this application and the features in the embodiments can be combined with each other if there is no conflict. The present invention will be described in detail with reference to the accompanying drawings and in conjunction with the embodiments hereinafter.

Figure 1:
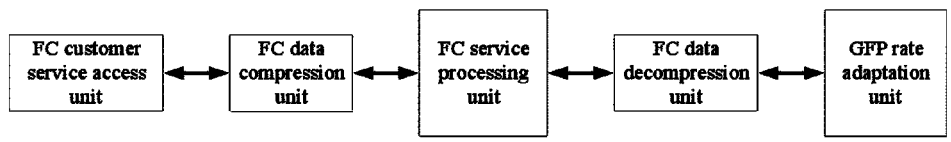
FIG. 1 is a structure schematic diagram of an apparatus for processing FC service data according to an embodiment of the present invention.

FIG. 1 is a structure schematic diagram of an apparatus for processing FC service data according to an embodiment of the present invention. As shown in FIG. 1, this system comprises: a FC customer service access unit, a FC data compression unit, a FC service processing unit, a FC data decompression unit and a Generic Framing Procedure (hereinafter referred to as GFP) rate adaptation unit, wherein the FC customer service access unit is configured to support accessing and rate adaptation of the FC service, and the FC customer service access unit also can perform code conversion according to the accessed FC service so as to facilitate the subsequent FC data compression; the FC data compression unit is configured to compress the K code indicator bit and the ERR code indicator bit into a K/ERR code indicator bit, and compress the 8b codes and the K/ERR code indicator bit into 9b codes; the FC service processing unit is configured to process and transmit the 9b codes; the FC data decompression unit is configured to decompress the 9b codes into 8b codes and a K/ERR code indicator bit, and decompress the K/ERR code indicator bit into a K code indicator bit and an ERR code indicator bit; the GFP rate adaptation unit is configured to adapt the decompressed FC data to a rate which is needed by the Optical Transport Network (hereinafter referred to as OTN) or the Synchronous Digital Hierarchy (hereinafter referred to as SDH) mapping.

Figure 2:
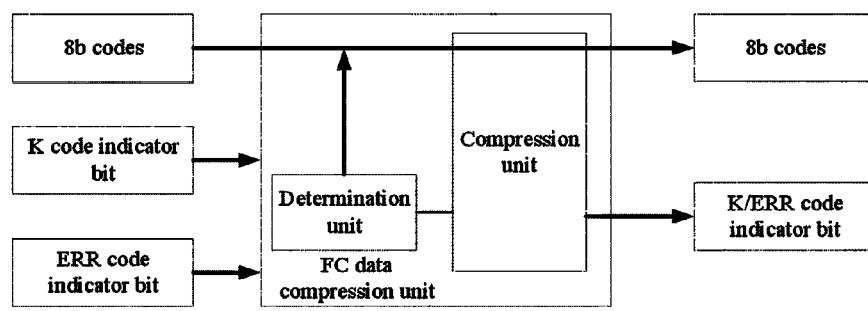
FIG. 2 is a structure schematic diagram of a FC data compression unit according to an embodiment of the present invention.

FIG. 2 is a structure schematic diagram of the FC data compression unit according to an embodiment of the present invention. As shown in FIG. 2, the FC data compression unit comprises: a determination unit and a compression unit, wherein, the determination unit is configured to compress a K code indicator bit and an ERR code indicator bit into a K/ERR code indicator bit; the compression unit is configured to compress 8b codes and the K/ERR code indicator bit into 9b codes. The determination unit compressing the K code indicator bit and the ERR code indicator bit into a K/ERR code indicator bit specifically comprises: judging whether an ERR code is contained in the currently received FC data, wherein if an ERR code is contained, then encoding the ERR code indicator bit into a K/ERR code indicator bit; if an ERR code isn't contained, then judging whether a K code is contained in the currently received FC data, wherein if a K code is contained, then encoding the K code indicator bit into a K/ERR code indicator bit, and if a K code is not contained, encoding the K/ERR code indicator bit into an indicator bit without a K code or an ERR code.

Figure 3:
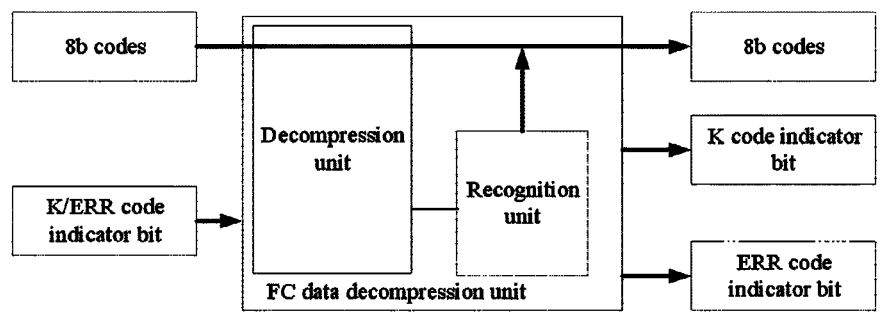
FIG. 3 is a structure schematic diagram of a FC data decompression unit according to an embodiment of the present invention.

FIG. 3 is a structure schematic diagram of the FC data decompression unit according to an embodiment of the present invention. As shown in FIG. 3, the FC data decompression unit comprises: a decompression unit and a recognition unit, wherein, the decompression unit is configured to decompress 9b codes into 8b codes and a K/ERR code indicator bit; the recognition unit is configured to decompress the K/ERR code indicator bit into a K code indicator bit and an ERR code indicator bit. The recognition unit decompressing the K/ERR code indicator bit into a K code indicator bit and an ERR code indicator bit specifically comprises: determining whether an ERR code or a K code is contained in the currently received FC data according to the K/ERR code indicator bit, wherein if an ERR code or a K code is contained, then judging whether the ERR code is contained in the currently received FC data according to the specific content of the 8b codes, and if the ERR code is contained, then the K/ERR code indicator bit is determined to be an ERR code indicator bit, and if the K code is contained, then the K/ERR code indicator bit is determined to be a K code indicator bit; if neither the ERR code nor the K code is contained, the K/ERR code indicator bit is determined to be an indicator bit without a K code or an ERR code.

In the FC data, the K code is reserved data used in frame header synchronization processing, serial-parallel conversion processing and etc., and the K code indicator bit is used for identifying whether the K code is contained in current FC data; the ERR code is used for identifying whether the transmission of FC data is correct, and the ERR code indicator bit is used for identifying whether the ERR code is contained in current FC data.

Since the K code and the ERR code are not transmitted in the FC data simultaneously, therefore, in the present invention, only 1b is adopted to represent the existing 2b of the K code indicator bit and the ERR code indicator bit. And according to regulations of the FC data format in existing protocols, if a K code is contained in the FC data, then the 8b codes cannot be all 0. In this way, when the FC data is compressed, the value of the K/ERR code indicator bit is determined depending on whether a K code or an ERR code is contained currently in FC data. During the decompression of the FC data, according to the value of the K/ERR code indicator bit in combination with the specific content of the 8b codes, the K/ERR code indicator bit can be determined to be a K code indicator bit or an ERR code indicator bit.

Figure 4:
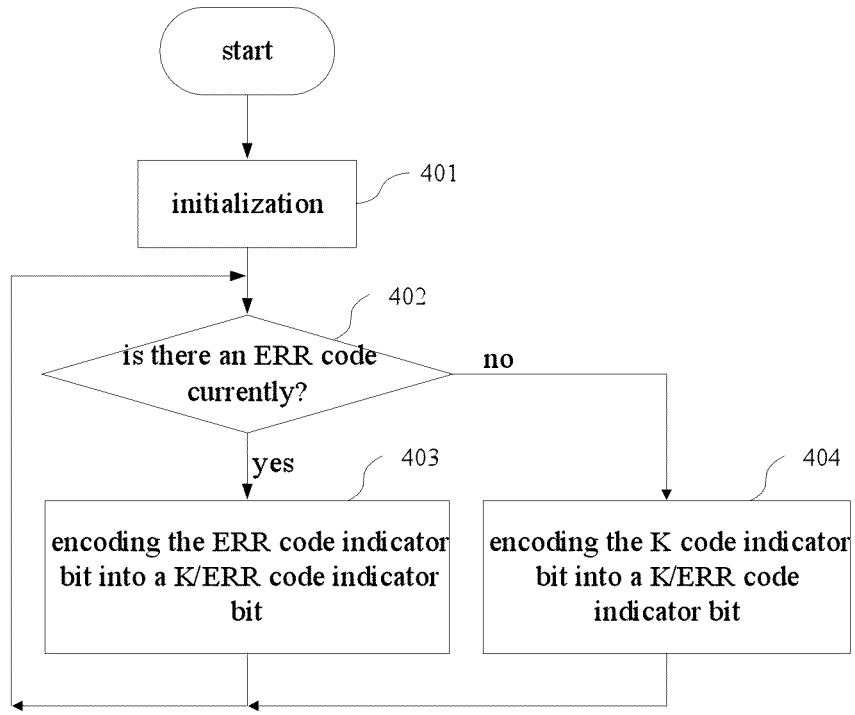
FIG. 4 is a schematic flowchart of compressing FC data according to an embodiment of the present invention.

FIG. 4 is a schematic flowchart of compressing FC data according to an embodiment of the present invention, the compression is performed by the FC data compression unit, as shown in FIG. 4, the process for compressing the FC data comprises the follow steps.

Step 401: initialize the FC service data processing apparatus is, for example, adapting rate, converting codes according to accessed FC service and etc., so as to facilitate the compression of the FC data.

Step 402: judge whether an ERR code is contained in the currently received FC data, if an ERR code is contained, then perform step 403; if an ERR code is not contained, then perform step 404.

Step 403: encode the ERR code indicator bit into a K/ERR code indicator bit, and then turn to step 402.

Step 404: judge whether a K code is contained in the currently received FC data, wherein if a K code is contained, then encode the K code indicator bit into a K/ERR code indicator bit, then turn to step 402; if a K code is not contained, encode the K/ERR code indicator bit into an indicator bit without a K code or an ERR code, and turn to step 402.

Figure 5:
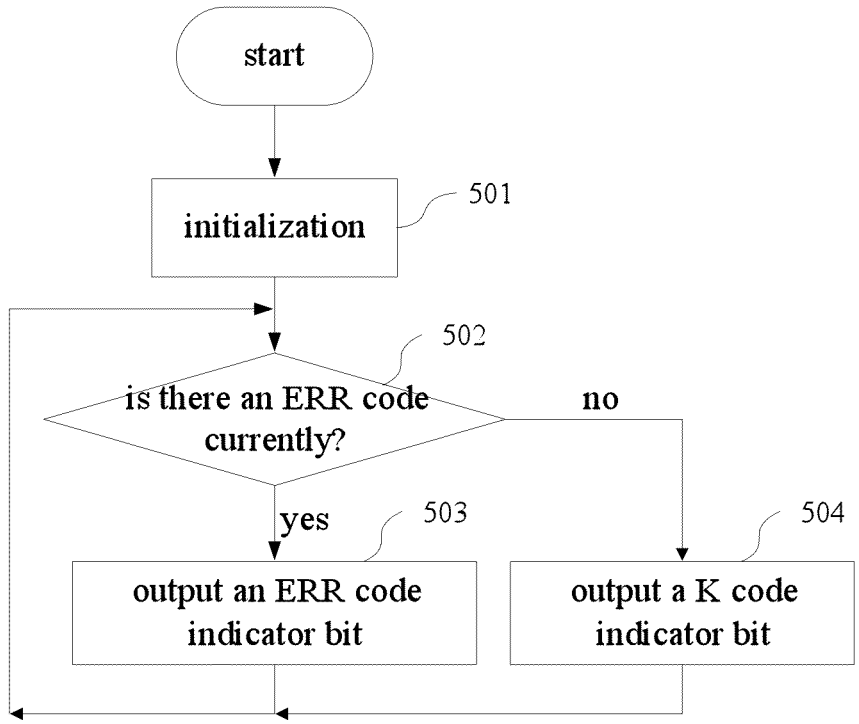
FIG. 5 is a schematic flowchart of decompressing FC data according to an embodiment of the present invention.

FIG. 5 is a schematic flowchart of decompressing FC data according to an embodiment of the present invention. The decompression is performed by the FC data decompression unit. As shown in FIG. 5, the process of decompressing the FC data comprises:

Step 501: initialize the FC service data processing apparatus, for example, adapting rate, converting codes according to accessed FC service and etc., so as to facilitate the decompression of the FC data.

Step 502: determine whether an ERR code or a K code is contained in the currently received FC data according to the K/ERR code indicator bit, wherein if an ERR code or a K code is contained, then judge whether the ERR code is contained in the currently received FC data according to the specific content of the 8b codes, and if the ERR code is contained, then perform step 503; if the K code is contained, then perform step 504. If neither the ERR code nor the K code is contained, determine the K/ERR code indicator bit to be an indicator bit without a K code or an ERR code, and then perform step 502 continuously.

Step 503: determine the K/ERR code indicator bit to be an ERR code indicator bit, and then turn to step 502.

Step 504: determine the K/ERR code indicator bit to be a K code indicator bit, and then turn to step 502.

If the K/ERR code indicator bit is 1 represents that an ERR code or a K code is contained in the currently received FC data, then in the specific process for compressing the FC data, the K/ERR code indicator bit is encoded into 1 so long as the ERR code or the K code is contained in the currently received FC data; when neither the ERR code nor the K code is contained in the currently received FC data, the K/ERR code indicator bit is encoded into 0. Correspondingly, in the specific process for decompressing the FC data, if the K/ERR code indicator bit is determined to be 0, it represents that neither the ERR code nor the K code is contained in the currently received FC data; if the K/ERR code indicator bit is determined to be 1, then continuously determine whether the ERR code or the K code is contained in the currently received FC data in combination with the specific content of the 8b codes, if the specific content of the 8b codes is all 0, then it represents that the ERR code is contained in the currently received FC data, determine the K/ERR code indicator bit to be an ERR code indicator bit; if the specific content of the 8b codes is not all 0, then it represents that the K code is contained in the currently received FC data, determine the K/ERR code indicator bit to be a K code indicator bit.

Above description is only to illustrate the preferred embodiments but not to limit the present invention. Various alterations and changes to the present invention are apparent to those skilled in the art. The scope defined in claims shall comprise any modification, equivalent substitution and improvement within the spirit and principle of the present invention.

What is claimed is:

1. A method for compressing data in Fiber Channel (FC) services, comprising:
   compressing a K code indicator bit and an ERR code indicator bit into a K/ERR code indicator bit, and compressing 8b codes and the K/ERR code indicator bit into 9b codes.

2. The method according to claim 1, wherein compressing a K code indicator bit and an ERR code indicator bit into a K/ERR code indicator bit comprises: judging whether an ERR code is contained in the currently received FC data, wherein if the ERR code is contained, then encoding the ERR code indicator bit into a K/ERR code indicator bit; if the ERR code is not contained, then judging whether a K code is contained in the currently received FC data, and if the K code is contained, then encoding the K code indicator bit into a K/ERR code indicator bit, if the K code is not contained, encoding the K/ERR code indicator bit into an indicator bit without a K code or an ERR code.

3. The method according to claim 1, wherein, after the 9b codes are obtained from the compression, the method further comprises: decompressing the 9b codes into 8b codes and a K/ERR code indicator bit, and decompressing the K/ERR code indicator bit into a K code indicator bit and an ERR code indicator bit.

4. The method according to claim 3, wherein decompressing the K/ERR code indicator bit into a K code indicator bit and an ERR code indicator bit comprises: determining whether an ERR code or a K code is contained in the currently received FC data according to the K/ERR code indicator bit, wherein if the ERR code or the K code is contained, then judging whether the ERR code is contained in the currently received FC data according to the specific content of the 8b codes, wherein if the ERR code is contained, then the K/ERR code indicator bit is determined to be an ERR code indicator bit, and if the K code is contained, then the K/ERR code indicator bit is determined to be a K code indicator bit; if neither the ERR code nor the K code is contained, the K/ERR code indicator bit is determined to be an indicator bit without a K code or an ERR code.

5. The method according to claim 2, wherein, after the 9b codes are obtained from the compression, the method further comprises: decompressing the 9b codes into 8b codes and a K/ERR code indicator bit, and decompressing the K/ERR code indicator bit into a K code indicator bit and an ERR code indicator bit.

6. A method for decompressing data in Fiber Channel services, comprising: decompressing 9b codes into 8b codes and a K/ERR code indicator bit, and decompressing the K/ERR code indicator bit into a K code indicator bit and an ERR code indicator bit.

7. The method according to claim 6, wherein decompressing the K/ERR code indicator bit into a K code indicator bit and an ERR code indicator bit comprises: determining whether an ERR code or a K code is contained in the currently received FC data according to the K/ERR code indicator bit, wherein if the ERR code or the K code is contained, then judging whether the ERR code is contained in the currently received FC data according to the specific content of the 8b codes, wherein if the ERR code is contained, then the K/ERR code indicator bit is determined to be an ERR code indicator bit, if the K code is contained, then the K/ERR code indicator bit is determined to be a K code indicator bit; if neither the ERR code nor the K code is contained, the K/ERR code indicator bit is determined to be an indicator bit without a K code or an ERR code.

8. An apparatus for compressing data in FC services, comprising: a determination unit and a compression unit, wherein,
the determination unit is configured to compress a K code indicator bit and an ERR code indicator bit into a K/ERR code indicator bit;
the compression unit is configured to compress 8b codes and the K/ERR code indicator bit into 9b codes.

9. The apparatus according to claim 8, wherein the determination unit compressing a K code indicator bit and an ERR code indicator bit into a K/ERR code indicator bit specifically comprises: judging whether an ERR code is contained in the currently received FC data, wherein if the ERR code is contained, then encoding the ERR code indicator bit into a K/ERR code indicator bit; if the ERR code is not contained, then judging whether a K code is contained in the currently received FC data, wherein if the K code is contained, then encoding the K code indicator bit into a K/ERR code indicator bit, and if the K code is not contained, encoding the K/ERR code indicator bit into an indicator bit without a K code or an ERR code.

10. An apparatus for decompressing data in FC services, comprising: a decompression unit and a recognition unit, wherein,
the decompression unit is configured to decompress 9b codes into 8b codes and a K/ERR code indicator bit;
the recognition unit is configured to decompress the K/ERR code indicator bit into a K code indicator bit and an ERR code indicator bit.

11. The apparatus according to claim 10, wherein the recognition unit decompressing the K/ERR code indicator bit into a K code indicator bit and an ERR code indicator bit specifically comprises: determining whether an ERR code or a K code is contained in the currently received FC data according to the K/ERR code indicator bit, wherein if the ERR code or the K code is contained, then judging whether the ERR code is contained in the currently received FC data according to the specific content of the 8b code, wherein if the ERR code is contained, then the K/ERR code indicator bit is determined to be an ERR code indicator bit, if the K code is contained, and then the K/ERR code indicator bit is determined to be a K code indicator bit; if neither the ERR code nor the K code is contained, the K/ERR code indicator bit is determined to be an indicator bit without a K code or an ERR code.

* * * * *